United States Patent
Frank et al.

(10) Patent No.: US 9,571,050 B2
(45) Date of Patent: Feb. 14, 2017

(54) IMPLEMENTING ENHANCED BIAS CONFIGURATION FOR CMOS INVERTER BASED OPTICAL TRANSIMPEDANCE AMPLIFIER

(71) Applicant: International Business Machines Corporation, Armonk, NY (US)

(72) Inventors: Matthew B. Frank, Rochester, MN (US); Jonathan E. Proesel, Yorktown Heights, NY (US); Raymond A. Richetta, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/696,420

(22) Filed: Apr. 25, 2015

(65) Prior Publication Data

US 2016/0226457 A1    Aug. 4, 2016

Related U.S. Application Data

(63) Continuation of application No. 14/611,730, filed on Feb. 2, 2015.

(51) Int. Cl.
*H03F 3/08* (2006.01)
*H03F 3/45* (2006.01)

(52) U.S. Cl.
CPC .......... *H03F 3/45179* (2013.01); *H03F 3/082* (2013.01); *H03F 3/45183* (2013.01); *H03F 2200/153* (2013.01); *H03F 2203/45264* (2013.01)

(58) Field of Classification Search
CPC ....................................................... H03F 3/08
USPC ....................................... 330/308; 250/214 A
See application file for complete search history.

(56) References Cited

U.S. PATENT DOCUMENTS

| | | | |
|---|---|---|---|
| 5,343,160 A | 8/1994 | Taylor | |
| 7,319,365 B2 | 1/2008 | Fujita | |
| 7,734,193 B2 | 6/2010 | Dat | |
| 8,139,957 B2 * | 3/2012 | Bowler | H03F 1/48 250/214 A |
| 8,471,639 B2 | 6/2013 | Welch | |
| 9,276,535 B2 | 3/2016 | van Sinderen et al. | |
| 2002/0105385 A1 | 8/2002 | Buescher | |

(Continued)

FOREIGN PATENT DOCUMENTS

| | | |
|---|---|---|
| WO | 9928768 A2 | 6/1999 |
| WO | 9929056 A2 | 6/1999 |
| WO | 2009117102 A2 | 9/2009 |

OTHER PUBLICATIONS

Appendix P—List of IBM Patents or Patent Applications Treated As Related—May 6, 2015.

(Continued)

*Primary Examiner* — Henry Choe
(74) *Attorney, Agent, or Firm* — Joan Pennington

(57) ABSTRACT

A method and circuit are provided for implementing an enhanced bias configuration for CMOS inverter based optical Transimpedance Amplifiers (TIAs). An operational amplifier is provided in a feedback configuration that forces an input of the CMOS inverter to a set voltage level by regulation of the inverter power supply. A photo-detector sees a more stable bias voltage, and the responsivity of the photo-detector is more robust and the TIA has improved performance across process corners.

5 Claims, 6 Drawing Sheets

(56) References Cited

U.S. PATENT DOCUMENTS

2014/0340151 A1* 11/2014 van Sinderen .......... H03F 3/193
330/260

OTHER PUBLICATIONS

International Search Report and Written Opinion of the ISA dated May 30, 2016—International Application No. PCT/IB2016/050245.

* cited by examiner

PRIOR ART

100

IMPLEMENTING ENHANCED BIAS CONFIGURATION FOR CMOS INVERTER BASED OPTICAL TRANSIMPEDANCE AMPLIFIER

This application is a continuation application of Ser. No. 14/611,730 filed Feb. 2, 2015.

FIELD OF THE INVENTION

The present invention relates generally to the data processing field, and more particularly, relates to a method and circuit for implementing an enhanced bias configuration for CMOS inverter based optical Transimpedance Amplifiers (TIAs), and a design structure on which the subject circuit resides.

DESCRIPTION OF THE RELATED ART

FIG. 1 illustrates complementary metal oxide semiconductor (CMOS) inverters with resistors in feedback that are often used as Transimpedance Amplifiers (TIAs) for the initial current to voltage conversion and amplification of a photo-detector output current. Although a TIA built as an inverter with a feedback resistor connected to a photo-detector will bias the photo-detector at ½ of VDD, this configuration has several drawbacks.

First, the bias voltage of the input depends on matching the relative drive strength of the NFET and PFET devices. If due to process variations the PFET strength is higher than that of the NFET the input will be above ½ VDD while if the converse occurs and the NFET is the stronger device then input we be lower than ½ VDD.

Photo-detector responsivity and DC bias current are two important parameters that need to be tightly controlled. Control of these parameters is difficult to achieve when the TIA input bias is not regulated.

A need exists for a method and circuit for implementing an enhanced bias configuration for CMOS inverter based optical Transimpedance Amplifiers (TIAs).

SUMMARY OF THE INVENTION

Principal aspects of the present invention are to provide a method and circuit for implementing an enhanced bias configuration for CMOS inverter based optical Transimpedance Amplifiers (TIAs), and a design structure on which the subject circuit resides. Other important aspects of the present invention are to provide such method, circuit and design structure substantially without negative effects and that overcome many of the disadvantages of prior art arrangements.

In brief, a method and circuit are provided for implementing an enhanced bias configuration for CMOS inverter based optical Transimpedance Amplifiers (TIAs). An operational amplifier is provided in a feedback configuration that forces an input of the TIA CMOS inverter to a set voltage level by regulation of the inverter power supply. A photo-detector sees a more stable bias voltage, and the responsivity of the photo-detector is more robust and the TIA has improved performance across process corners.

In accordance with features of the invention, the CMOS inverter based optical transimpedance amplifier (TIA) includes a photo-detector, the TIA formed by a series connected P-channel field effect transistor (PFET) and N-channel field effect transistor (NFET) and an associated feedback resistor, and the replica TIA is formed by a series connected PFET and an NFET and an feedback resistor.

In accordance with features of the invention, the feedback operational amplifier provides a gate input to a feedback PFET connected between a voltage supply rail VDD and the common source connection of the TIA series connected PFET and NFET and the replica TIA series connected PFET and NFET. The feedback operational amplifier and the feedback PFET provide a current bias and supply voltage regulation for the TIA. The feedback operational amplifier has high enough gain to cause the TIA input to be biased at ¼ VDD and the feedback PFET provides the bias current to run both the replica and photo-detector connected TIAs. Since the TIA and replica TIA PFETs are equal size and the TIA and replica TIA NFETs are equal size the input bias at the photo-detector connected TIA is set to ¼ VDD as well. It should be noted that ¼ VDD is chosen here and is generated by a 3R/R voltage divider while another voltage reference could be used such as a bandgap or other voltage reference. Also a voltage other than ¼ VDD could be chosen as well under some conditions.

In accordance with features of the invention, the feedback operational amplifier provides a gate input to a feedback NFET connected between a ground rail and a common source connection of the TIA NFET and the replica TIA NFET.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing an enhanced bias configuration for CMOS inverter based optical Transimpedance Amplifiers (TIAs), and a design structure on which the subject circuit resides.

Figure 1:
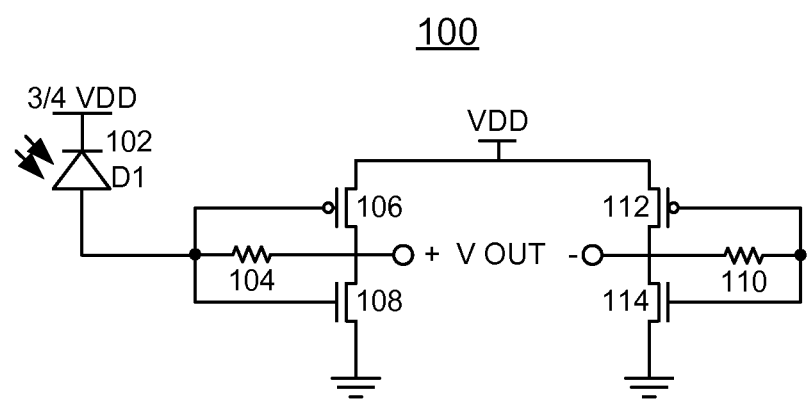
FIG. 1 is a schematic and block diagram of a conventional bias configuration for CMOS inverter based optical Transimpedance Amplifiers (TIA)
Figure 2:
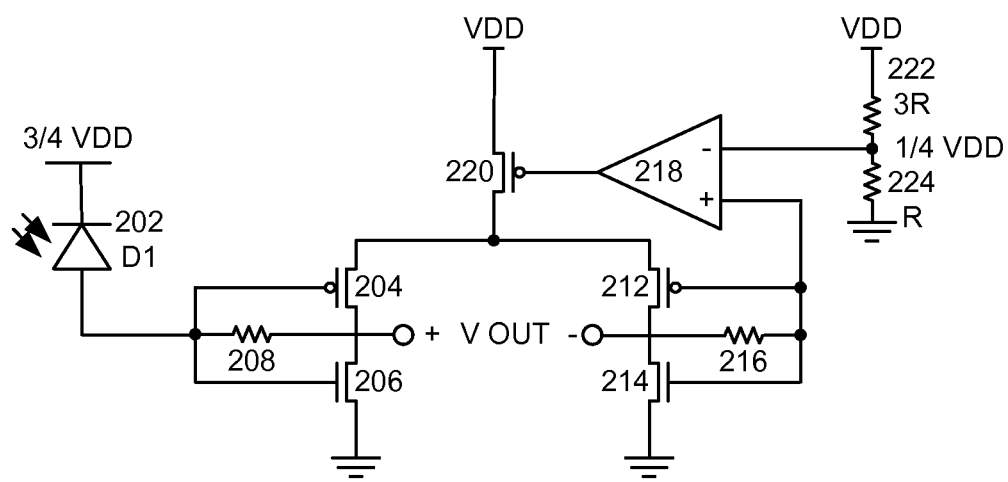
FIG. 2 is a schematic and block diagram of an example circuit for implementing an enhanced bias configuration for CMOS inverter based optical Transimpedance Amplifiers (TIA) in accordance with preferred embodiments.

Having reference now to the drawings, in FIG. 2, there is shown an example circuit generally designated by the reference character 200 for implementing an enhanced bias configuration for CMOS inverter based optical Transimpedance Amplifiers (TIAs) in accordance with preferred embodiments.

Circuit 200 is a CMOS inverter based optical transimpedance amplifier (TIA) including a photo-detector 202, D1, a TIA formed by a series connected P-channel field effect transistor (PFET) 204 and N-channel field effect transistor (NFET) 206 and an associated feedback resistor 208, and the replica TIA is formed by a series connected PFET 212 and an NFET 214 and an feedback resistor 216.

Circuit 200 includes a feedback operational amplifier 218 that provides a gate input to a feedback PFET 220 connected between a voltage supply rail VDD and the common source connection of the TIA series connected PFET 204 and NFET 206 and the replica TIA series connected PFET 212 and NFET 214. The feedback operational amplifier 218 and the feedback PFET 220 provide a current bias and supply voltage regulation for the TIA. The feedback operational amplifier 218 has sufficient gain to cause the TIA input to be biased at ¼ VDD and the feedback PFET 220 provides the bias current to run both the replica and photo-detector connected TIAs. Since the TIA and replica TIA PFETs 204, 212 are equal size and the TIA and replica TIA NFETs 206, 214 are equal size the input bias at the photo-detector 202 connected TIA is set to ¼ VDD as well. It should be noted that ¼ VDD is chosen here and is generated by a voltage divider formed by a series connected resistor 222, 3R and resistor 224, R while another voltage reference could be used such as a bandgap or other voltage reference. Also a voltage other than ¼ VDD could be chosen as well under some conditions.

Figure 3:
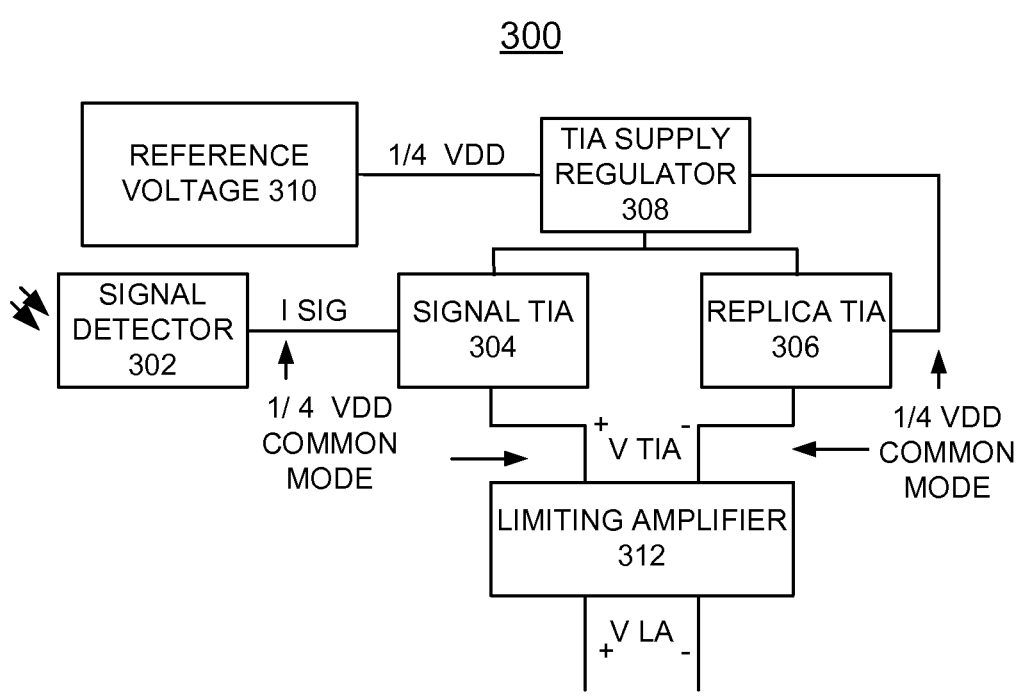
FIG. 3 is a block diagram of the example circuit of FIG. 2 for implementing an enhanced bias configuration for CMOS inverter based optical Transimpedance Amplifiers (TIA) in accordance with preferred embodiments.

Referring to FIG. 3, there is shown an example circuit generally designated by the reference character 300 for implementing an enhanced bias configuration for CMOS inverter based optical Transimpedance Amplifiers (TIA) in accordance with preferred embodiments. FIG. 3 is a block diagram of the entire signal path based on the TIA, for example, of the circuit 200 as shown in FIG. 2.

As shown, circuit 300 includes a signal detector 302, a signal TIA 304, a replica TIA 306, a TIA supply regulator 308, a reference voltage 310, and a limiting amplifier 312. For example, circuit 200 of FIG. 2 implements the signal detector 302, the signal TIA 304, the replica TIA 306, the TIA supply regulator 308, the reference voltage 310 that drives the limiting amplifier 312 as shown in FIG. 3. As shown in both FIGS. 2 and 3, the bias voltage TIA and replica TIA, and the output V TIA of ¼ VDD common mode voltage as shown is optionally chosen and another voltage could be provided as well depending on the application.

Figure 4:
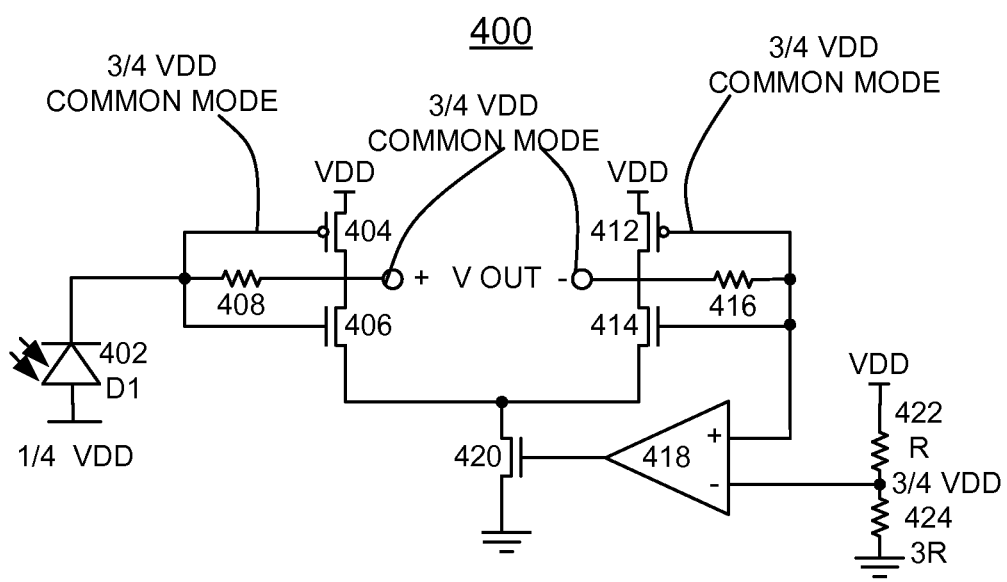
FIG. 4 is a schematic and block diagram of another example circuit for implementing an enhanced bias configuration for CMOS inverter based optical Transimpedance Amplifiers (TIA) in accordance with preferred embodiments.

Referring to FIG. 4, there is shown another example circuit generally designated by the reference character 400 for implementing an enhanced bias configuration for CMOS inverter based optical Transimpedance Amplifiers (TIA) in accordance with preferred embodiments.

Circuit 400 is another CMOS inverter based optical transimpedance amplifier (TIA) including a photo-detector 402, D1, a TIA formed by a series connected P-channel field effect transistor (PFET) 404 and N-channel field effect transistor (NFET) 406 and an associated feedback resistor 408, and the replica TIA is formed by a series connected PFET 412 and an NFET 414 and an feedback resistor 416.

The feedback operational amplifier 418 provides a gate input to the feedback NFET 420 connected between a ground rail and a common source connection of the TIA NFET 406 and the replica TIA NFET 414. The feedback operational amplifier 418 and the feedback NFET 420 provide a current bias and supply voltage regulation for the TIA. Since the TIA and replica TIA PFETs 404, 412 are equal size and the TIA and replica TIA NFETs 406, 414 are equal size the input bias at the photo-detector 402 connected TIA is set to ¾ VDD as well.

It should be noted that ¾ VDD is chosen here and is generated by a voltage divider formed by a series connected resistor 422, R and resistor 424, 3R while another voltage reference could be used such as a bandgap or other voltage reference. Also a voltage other than ¾ VDD could be chosen as well under some conditions.

Figure 5:
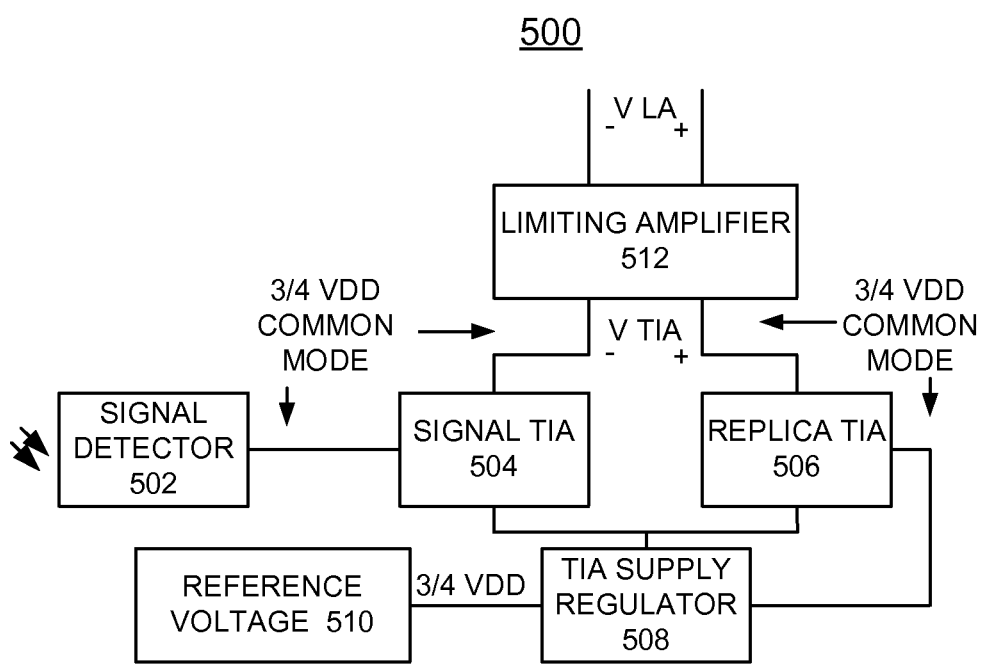
FIG. 5 is a block diagram of the example circuit of FIG. 4 for implementing an enhanced bias configuration for CMOS inverter based optical Transimpedance Amplifiers (TIA) in accordance with preferred embodiments.

Referring to FIG. 5, there is shown example circuit generally designated by the reference character 500 for implementing an enhanced bias configuration for CMOS inverter based optical Transimpedance Amplifiers (TIA) in accordance with preferred embodiments. FIG. 5 is a block diagram of the entire signal path based on the TIA, for example, as shown in FIG. 4.

As shown, circuit 500 includes a signal detector 502, a signal TIA 504, a replica TIA 506, a TIA supply regulator 508, a reference voltage 510, and a limiting amplifier 512. For example, the signal detector 502, the signal TIA 504, the replica TIA 506, the TIA supply regulator 508, the reference voltage 510 are implemented by the circuit 400 of FIG. 4. For example, circuit 400 in turn drives the limiting amplifier 512 (not shown in FIG. 4) and then finally an off chip driver.

It should be understood that the ¾ and ¼ VDD voltage supplies to the detector are example design choice values, and are not necessarily fixed.

Figure 6:
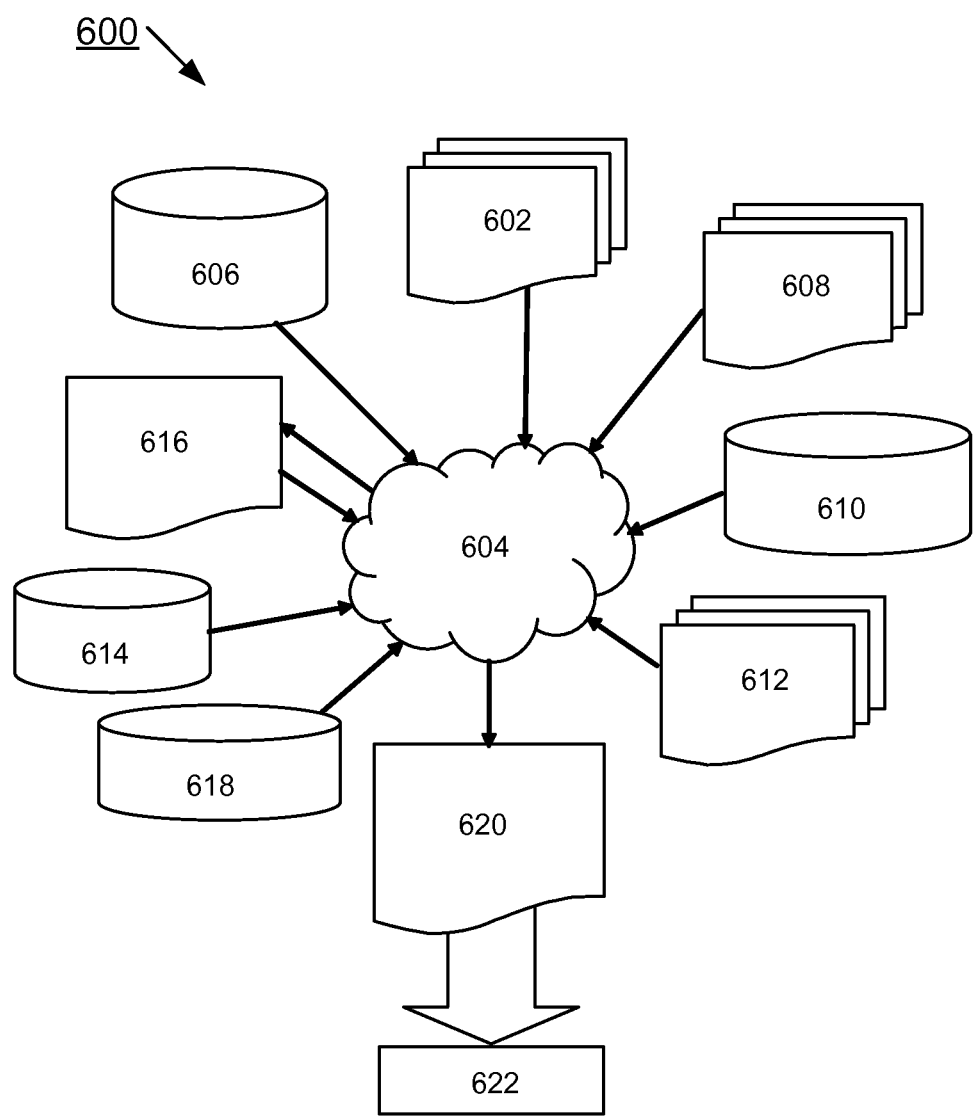
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuits 200, 300, 400, and 500 in the form of schematics or HDL, a hardware-description language, for example, Verilog, VHDL, C, and the like. Design structure 602 may be contained on one or more machine readable medium. For example, design structure 602 may be a text file or a graphical representation of circuits 200, 300, 400, and 500. Design process 604 preferably synthesizes, or translates, circuits 200, 300, 400, and 500 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 2, 3, 4, and 5 along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2, 3, 4, and 5. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing an enhanced bias configuration for CMOS inverter based optical Transimpedance Amplifiers (TIAs) comprising the steps of:
   providing a Transimpedance Amplifier (TIA) and a replica TIA by forming said TIA by an inverter and a first feedback resistor and a photo-detector input, and forming said replica TIA by a replica inverter with a second feedback resistor;
   providing a voltage divider formed by series connected resistors connected between a voltage rail VDD and a ground rail for generating a first set voltage level;
   providing a first input of said operational amplifier with said first set voltage level;
   providing an operational amplifier in a feedback configuration for regulating a second set voltage level at the photo-detector input of said TIA; and providing said Transimpedance Amplifier (TIA) and a replica TIA includes providing each of said TIA and replica TIA formed by a series connected P-channel field effect transistor (PFET) and N-channel field effect transistor (NFET) and said associated feedback resistor.

2. The method as recited in claim 1 wherein providing an operational amplifier in a feedback configuration for regulating a second set voltage level at the photo-detector input of said TIA includes providing said operational amplifier with a first input receiving said second set voltage level and a second input receiving an input of said replica TIA.

3. The method as recited in claim 2 includes providing a field effect transistor (FET) receiving a gate input from an output of said operational amplifier and said FET providing a voltage reference to said TIA and said replica TIA.

4. The method as recited in claim 3 wherein providing said FET receiving a gate input from an output of said operational amplifier includes providing an N-channel field effect transistor (NFET) connected between a ground rail and a common source connection of said TIA NFET and said replica TIA NFET.

5. The method as recited in claim 3 wherein providing said FET receiving a gate input from an output of said operational amplifier includes providing a P-channel field effect transistor (PFET) connected between a voltage rail VDD and a common source connection of said TIA PFET and said replica TIA PFET.

* * * * *